United States Patent [19]

Ikeda

[11] Patent Number: 4,559,619

[45] Date of Patent: Dec. 17, 1985

[54] LARGE CAPACITY MEMORY CIRCUIT WITH IMPROVED WRITE CONTROL CIRCUIT

[75] Inventor: Hiroaki Ikeda, Tokyo, Japan

[73] Assignee: NEC Corporation, Tokyo, Japan

[21] Appl. No.: 452,986

[22] Filed: Dec. 27, 1982

[30] Foreign Application Priority Data

Dec. 25, 1981 [JP] Japan ................................. 56-215269

[51] Int. Cl.$^4$ ............................................. G11C 11/40
[52] U.S. Cl. .................................... 365/190; 365/203; 365/205
[58] Field of Search ............... 365/174, 189, 190, 202, 365/203, 205

[56] References Cited

U.S. PATENT DOCUMENTS

| | | | |
|---|---|---|---|
| 4,081,701 | 3/1978 | White, Jr. et al. | ............... 365/203 X |
| 4,138,740 | 2/1979 | Itoh | ...................................... 365/203 |
| 4,366,559 | 12/1982 | Misaizu et al. | ...................... 365/205 |

Primary Examiner—Joseph A. Popek
Attorney, Agent, or Firm—Sughrue, Mion, Zinn Macpeak & Seas

[57] ABSTRACT

A memory circuit which can operate with low power consumption. First and second bit lines are coupled to first and second input nodes of a sense amplifier through first and second transistors, respectively. The first transistor is disenabled with the second transistor enabled when a write data signal is applied to the second bit line. After the state of the sense amplifier is determined by the write data signal, the level of the first bit line is determined by the write data signal, the level of the first bit line is determined by the sense amplifier by the enabled first transistor.

9 Claims, 11 Drawing Figures

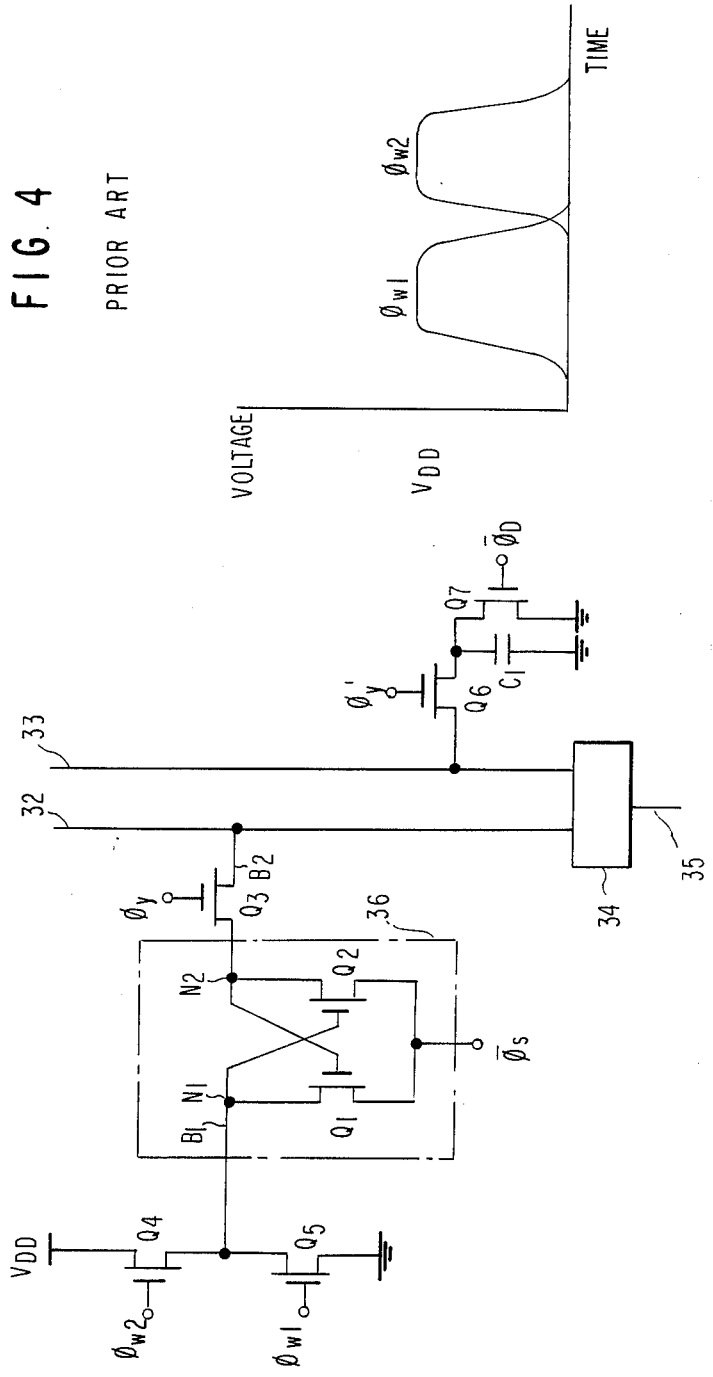

(a) READ-OUT (b) REWRITING (c) WRITING

LARGE CAPACITY MEMORY CIRCUIT WITH IMPROVED WRITE CONTROL CIRCUIT

The present invention relates to a dynamic random access memory (RAM) employing field effect transistors (FETs).

The recent progress achieved in the field of semiconductor integrated circuit art, especially fine working art has made a memory with a capacity of 64k bits per chip commercially available, and the situation is such that a memory of 256k bits is practically expected for development.

To obtain such memory circuit at high integration density, various approaches are contrived not only for the size and shape of memory cell but also for the layout with respect to sense amplifiers, decoders and memory cell array.

As a typical layout applied currently on RAM of large storage capacity, the array of memory cells including sense amplifiers is divided into two blocks as a whole. In each block, sense amplifiers are arrayed in the neighborhood of the center in row direction. Each bit line (called digit line otherwise) extending in column direction is provided on both sides of each sense amplifier, and a column selection decoder for selecting the sense amplifier to connect with a data bus is also laid out. In such memory circuit, true and complement output signals are derived differentially from a pair of input terminals of the sense amplifier which are connected to a pair of bit lines arranged on both sides of the same sense amplifier, or true and complement write signals are supplied differentially to the input terminals through double rails of data bus lines. The reason of employing such double rails of data bus lines is that when a pair of input/output nodes of a flip-flop constituting the sense amplifier come to a low level both, the flip-flop becomes floating, and thus an effective driving of the pair of bit lines cannot be expected simply from driving only one of the input/output node. Therefore, the column selection decoder must be disposed on both sides of the sense amplifier.

In such layout the column selection decoder must be provided along two rows in each block, thus coming to four rows for the whole memory. Thus the column selection decoder occupies comparatively a large area in the memory circuit layout, which must preferably be decreased.

From the above point of view, a possibility of decreasing the number of column selecting decoders has been examined by fetching a read-out signal only from the one of the pair of input terminals of the sense amplifier or by applying a write signal to the one input terminal only. To comply with the requirements above, there has been proposed the sense amplifier in which only one of a pair of input terminals is connected to a data bus by way of a column selection circuit and the other is connected to a power supply and ground potential by way of FET's. After a data is given for writing to the one input terminal by way of the column selection circuit, that on the ground side of the above FET's is made conducting to discharge the input terminal and the bit line connected thereto, FET on the power supply side is then made conducting, and the other input terminal and the bit line connected thereto are set to a voltage determined according to the conduction ratio of FET on the power supply side to a transistor of the flip-flop.

However, such proposed memory requires to have half of the bit lines charged and discharged repeatedly, for which a large power consumption will be unavoidable. This may counter the requirements of miniaturizing and integrating the system after all.

An object of the present invention is to provide a memory circuit which is high in integration and ready for operation on a low power consumption.

In the memory circuit according to the present invention, having a sense amplifier provided with a pair of input terminals, a pair of bit lines, means for connecting one of the input terminals of the sense amplifier to one of the bit lines, and a selection circuit for connecting the one bit line to a data bus, the improvement resides in that a switch circuit is provided between the other bit line and the other input terminal of the sense amplifier, and is kept at a low impedance for a given period of time after the state of the sense amplifier is established by a write data during the period for writing. The switch circuit is set at a high impedance at the point of time when the write data is given to the sense amplifier via the selection circuit, and the other bit line does not work on the sense amplifier as a load. Therefore, the status of the sense amplifier can be inverted easily by the write signal.

The sense amplifier may include a flip-flop circuit constituted of first and second field effect transistors connected crosswise at a pair of nodes, and the switch circuit may include a third field effect transistor inserted between either of the above nodes and a bit line. A variable impedance circuit may be inserted between the other node and the other bit line for connecting them, which operates for keeping a potential on the other node at a conductance necessary for inverting the status of the flip-flop circuit for a given time during data writing period. The variable impedance circuit can be realized by including a fourth field effect transistor inserted between the other node and the other bit line, a gate voltage of the fourth field effect transistor being kept higher than a supply voltage for a given time during a data writing period. The variable impedance circuit may further include a fifth field effect transistor connected in parallel with the fourth field effect transistor, a gate voltage of the field effect transistor being kept high for a given time during a data writing period. The variable impedance circuit may include a fourth field effect transistor inserted between the other node and the other bit line and a sixth field effect transistor inserted between the other node and a drain of the first or the second field effect transistor of the flip-flop circuit which is connected to the other node or between a source of the first or the second field effect transistor having the drain connected to the other node and a common contact of the flip-flop circuit, a gate voltage of the sixth field effect transistor being kept low for a given time during a data writing period.

BRIEF DESCRIPTION OF THE DRAWINGS

FIG. 3 is a fragmentary circuit diagram of the proposed memory system of FIG. 2;

FIG. 4 is a drawing showing waveforms of control signals of the circuit given in FIG. 3;

A prior art will be described with reference to FIG. 1 to FIG. 4.

Figure 1:
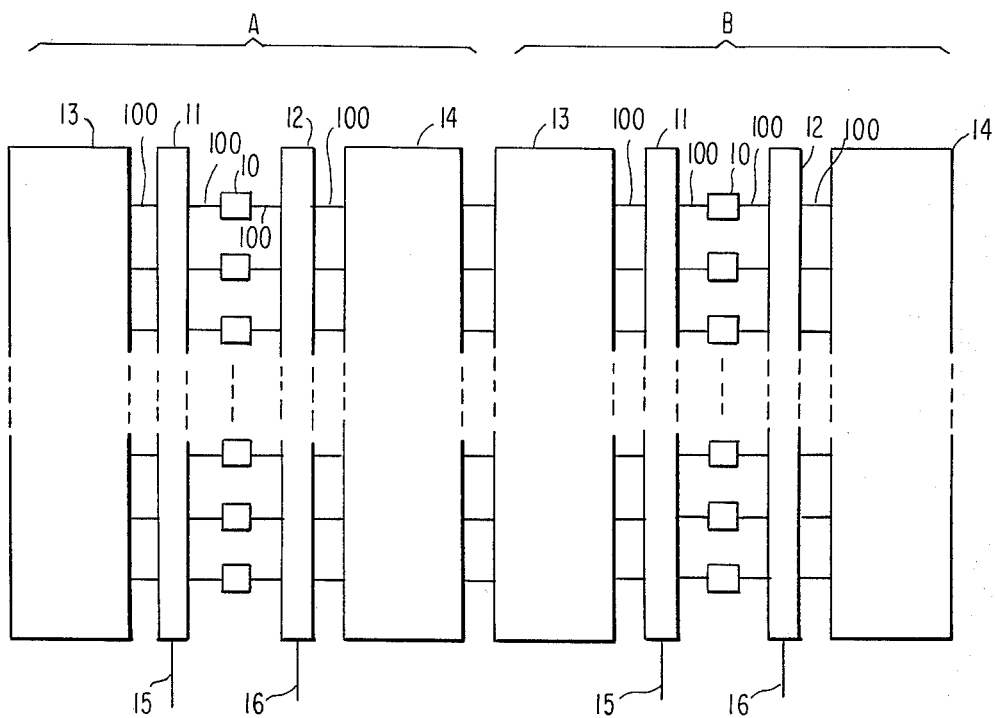
FIG. 1 is a layout drawing of memory cells in a conventional memory circuit.

FIG. 1 represents one example of a layout of memory cells and sense amplifiers for a 64k bit RAM used hitherto, which is divided into two blocks A and B as a whole. Both blocks are constituted in the following manner. Sense amplifier circuits 10 are arranged in 256 pieces vertically at the center of the respective blocks, and cell matrixes 13 and 14 are connected to both sides thereof by way of a bit line 100, Y (column) decoders 11 and 12. Y decoders 11 and 12 are combined with each other to select one piece of bit line among 256 pieces with 8 bits of inputs. Each of the cell matrix is constituted of 64 pieces of word lines and (256×64) pieces of memory cells coupled thereto, one piece of dummy word line and 256 pieces of dummy cells coupled thereto. I/O buses 15 and 16 are coupled to the Y decoders 11 and 12, respectively. An X (row) decoder (not illustrated) is disposed in each block, which operates for selecting the word line. The memory cell has a MISFET having gate connected to the word line and the drain connected to the bit line, and a capacitor having one each connected to the source of the MISFET and the other end supplied with a supply voltage $V_{DD}$ or $V_{SS}$ (ground). The word line is kept at a high level at the time of read-out, and the data stored in the capacitor of the selected memory cell is sent to the bit line. The data thus sent and an output specified beforehand of the dummy cell in the cell matrix on the counter side which is associated with the selected memory cell are applied on both bit lines coupled to a pair of input terminals of the sense amplifier consisting of a flip-flop circuit (F/F) as a differential input therefor, and the output detected and amplified by the sense amplifier is read out externally by the I/O bus 15 or 16. Simultaneously, the content of the selected memory cell is refreshed throughout the amplification by the sense amplifier.

In the circuit, read and write are carried out symmetrically from both sides of the sense amplifier circuit, and thus the Y (column) decoders are disposed symmetrically in two. This may result from the circumstances that when potentials on both nodes of F/F forming the sense amplifier come to a low level both, the circuit is kept floating and cannot be returned to a steady state only from one side.

It is therefore conceivable that if a data can be read and written only from one side of the sense amplifier, then the Y decoder will have not necessarily to be divided into four as shown in FIG. 1 and thus the number of decoders can be cut reasonably.

Figure 2:
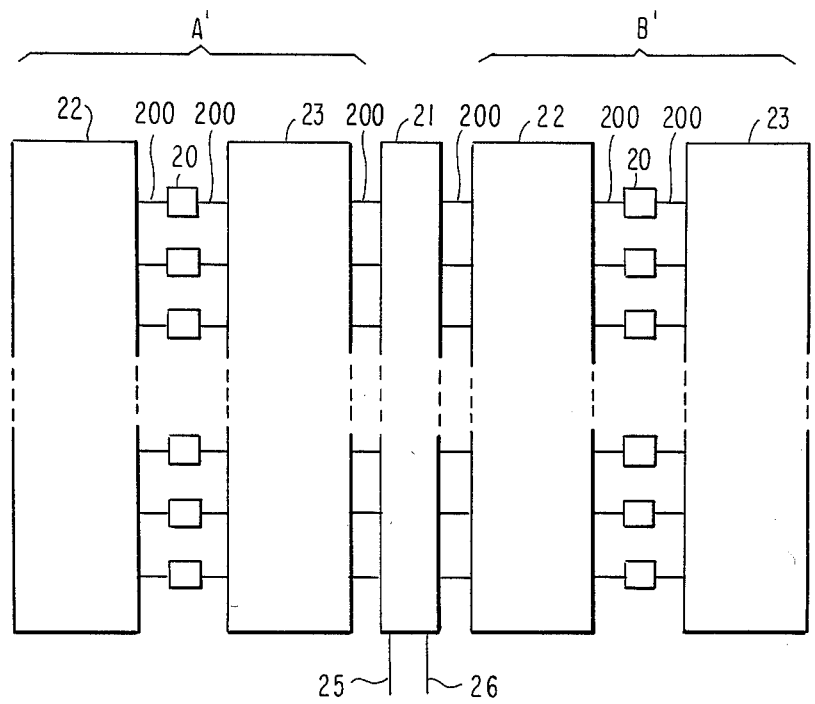
FIG. 2 is a drawing showing a proposed layout of a memory circuit.

FIG. 2 represents one example of a proposed layout of the memory cells and sense amplifiers circuit, which has been contrived from such conception.

A Y decoder 21 (that for which Y decoders 11 and 12 of FIG. 1 are put together with 8 inputs) is provided at the center of the two blocks A' and B', and cell matrixes 23, sense amplifier circuits 20, cell matrixes 22 are arrayed in that order on both sides through bit lines 200. The sense amplifier circuits 20 are arranged in 256 pieces vertically, and the cell matrixes 22 and 23 are constituted of 64 pieces of word lines and (256×64) pieces of memory cells coupled thereto, one piece of dummy word line and 256 pieces of dummy cells coupled thereto. I/O buses 25 and 26 are connected to the Y decoder 21.

From comparing circuits of FIG. 1 and FIG. 2 with each other, it is understood that the number of Y decoders in FIG. 2 can be cut to half of the circuit of FIG. 1, and thus an effect to contribute to requirements for miniaturization, high integration and low power consumption as a memory circuit will be exceedingly large.

The memory circuit given in FIG. 3 is a typical one of those which have been disclosed hitherto from this point of view. In a sense amplifier circuit 36 formed with FET's $Q_1$ and $Q_2$ in a cross connection at a pair of nodes $N_1$ and $N_2$. The node $N_2$ is connected to a bit line $B_2$ through a selecting FET $Q_3$ and further to an I/O bus 32 while the node $N_1$ is connected to an intermediate common node of FET's $Q_4$ and $Q_5$ connected in series through a bit line $B_1$. A drain of $Q_4$ is connected to $V_{DD}$ terminal while a source of $Q_5$ is grounded. Further, a reference signal generator including a capacitor $C_1$ and FETs $Q_6$ and $Q_7$ is connected to an I/O bus 33 positioned on a counter side which is paired with the I/O bus 32. The I/O buses 32 and 33 send a data to a main amplifier 34 consisting of F/F from which an output 35 is generated.

In this circuit a data is read as follows. With a column selection control signal $\phi_y$ at a high level ($V_{DD}$), and $\phi_{w1}$ and $\phi_{w2}$ at low level, FET $Q_3$ is kept on and FET's $Q_4$ and $Q_5$ are kept off. In this state, F/F 36 is activated by changing a control signal $\overline{\phi}_s$ from high level to low, a data written therein is taken into the bit line $B_2$ and given to one input of the main amplifier 34 through I/O bus 32. On the other hand, a charge stored beforehand in the capacitor $C_1$ (set at a value about half of the bit line capacity) on a resetting control signal $\overline{\phi}_D$ is fetched to the I/O bus 33 by way of FET $Q_6$ and given to another input of the main amplifier 34. Thus by detecting and amplifying a differential voltage between both input voltage on the main amplifier 34, an output of the sense amplifier 36, i.e. a data stored in the memory cell is read out.

Next, writing of a data will be described. A potential on the node $N_2$ becomes high or low in level by turning on FET $Q_3$ by the control signal $\phi_y$ in accordance with data "1" or "0" taken into the bit line $B_2$ from I/O bus 32. On the other hand, the node $N_2$ is kept high in level and the node $N_1$ low only from I/O bus 32, and even if the node $N_2$ is inverted to low level, the node $N_1$ is turned inactive both for $Q_1$ and $Q_2$ to be floated. Therefore a potential on the node $N_1$ cannot return to high level. Now, after potentials on the nodes $N_1$ and $N_2$ are decided first, the control signal $\phi_{w1}$ is kept at high level ($V_{DD}$), as shown in FIG. 4, to turn on FET $Q_5$, thereby discharging the bit line $B_1$ (the node $N_1$, accordingly). Then, simultaneously with keeping the control signal $\phi_{w1}$ at low level, the control signal $\phi_{w2}$ is kept at high level. Thus FET $Q_5$ is turned off and FET $Q_4$ on, and if the node $N_2$ is kept at high level. FET $Q_1$ is conducting and hence the potential on the node $N_1$ becomes a potential to be determined by the ratio of FET $Q_4$ to FET $Q_1$. The node $N_1$ becomes low in level essentially from keeping the ability of $Q_4$ smaller than $Q_1$. If the node $N_2$ is kept at low level, then FET $Q_1$ is turned off and the node $N_1$ becomes high in level. Namely, the potential on the node $N_1$ changes according to the potential on the node $N_2$, and thus a data is written from I/O bus 32 by way of the bit line B$_2$.

As described above, according to the circuit given in FIG. 3, a data can be read and written only from one side of the sense amplifier circuit and a memory layout like that of FIG. 2 is realizable, therefore the number of Y decoders can be cut to half of that required hitherto, and the chip can be miniaturized and integrated satisfactorily.

In the circuit, however, all bit lines on the counter side to a bit line for data writing must be charged and discharged once, as discribed in detail hereinabove, according to the control signals $\phi w_1$, $\phi w_2$ for writing operation. Namely, the charge and discharge may entail a requirement of large power consumption, and thus a low power consumption which is another major object to cut the number of decoders cannot be secured.

The invention will now be described in detail with reference to the accompanying drawings.

Figure 5:
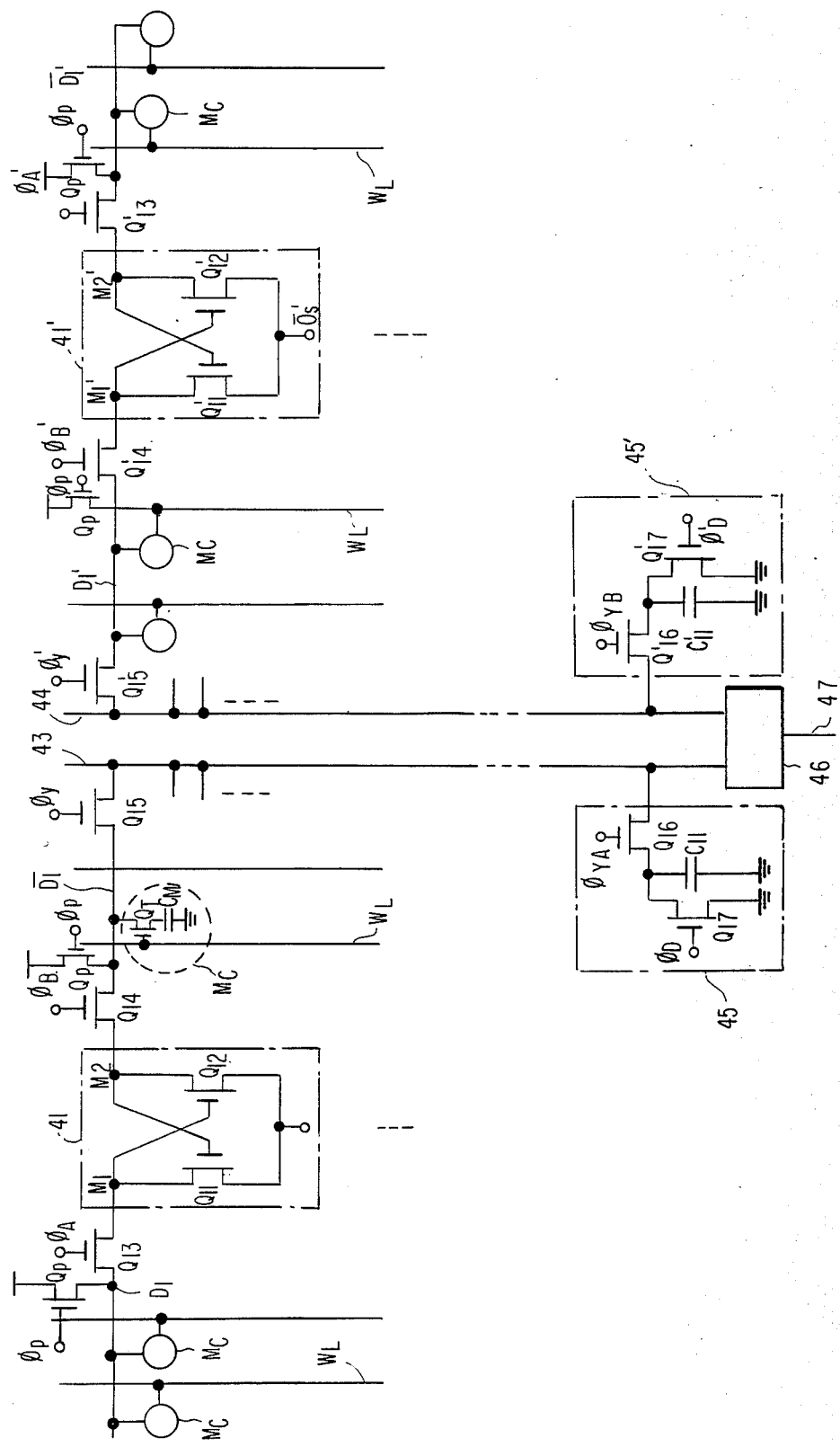
FIG. 5 is a circuit diagram of a memory system including a sense amplifier circuit of the first embodiment of the present invention.

A memory circuit according to the first embodiment of this invention is shown in FIG. 5.

In the embodiment, memory cells MC and sense amplifiers 41 and 41' are arrayed in two blocks A', B', in the similar manner as shown in FIG. 2. In the block A', bit lines D$_1$ and $\overline{D}_1$ are connected to input nodes M$_1$ and M$_2$ of a sense amplifier 41, respectively. The memory cells MC are arrayed at the intersections of bit lines and word lines WL. The memory cell MC is constituted of an FET Q$_T$ with its gate connected to the word line WL and a capacitor C$_M$. The bit line $\overline{D}_1$ is connected to I/O bus 43 by way of a selection FET Q$_{15}$. The block B' is constituted likewise.

A sense amplifier 41 comprises first and second FET's Q$_{11}$ and Q$_{12}$ in cross connection at a pair of nodes M$_1$ and M$_2$. In this arrangement, FET Q$_{13}$ is provided according to the present invention for controlling connection between the bit line D$_1$ and the input node M$_1$ of the sense amplifier 41. FET Q$_{14}$ is inserted between the input node M$_2$ and the other bit line $\overline{D}_1$, forming a holding circuit to hold a potential at the node M$_2$ at a potential necessary for inverting the state of the sense amplifier 41 for a given time during a data writing period. Provision of the FET Q$_{14}$ is for enhancing the effect of the present invention together with FET Q$_{13}$.

In FIG. 5, the constitution is given only for one bit of each block, therefore it goes without saying that a constitution for the bit line and sense amplifier similar to that of being illustrated therein will be formed in a given number.

Reference signal generators 45 and 45' are connected to each of I/O buses 43 and 44, and when the block A' side is selected, for example, by FET Q$_{15}$, the circuit 45' operates to give a reference potential to the I/O bus 44. On the other hand, when the block B' side is selected, the circuit 45 is driven and the reference potential is given to the I/O bus 43. Thus a sense amplifier 46 amplifies information from the block A' or B' and outputs a read-out data 47.

An operation of the circuits will be described in detail for each operation mode with reference to actuating waveform drawings of the control signals given in FIG. 6.

The following description then refers particularly to the sense amplifier 41.

(1) Reading/rewriting operation

Figure 6A:
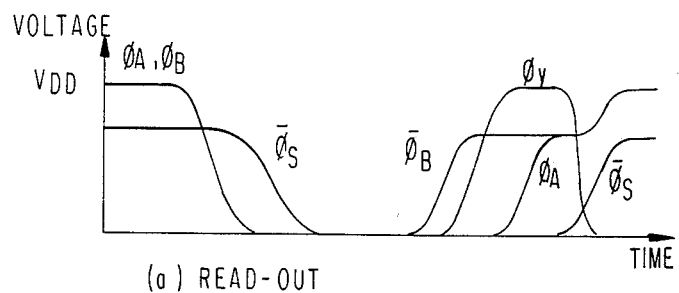
FIGS. 6(a), 6(b) and 6(c) are actuating waveform drawings of control signals for the sense amplifier circuit of the first embodiment of the invention.
Figure 6B:
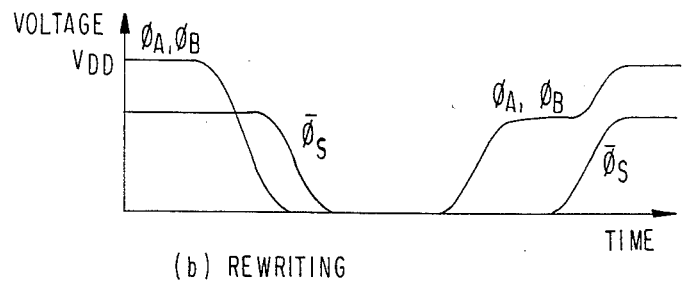

As shown in FIG. 6(a), control signals $\phi_A$, $\phi_B$ and $\overline{\phi}_S$ are kept at high level ($\phi_A$ and $\phi_B$ being V$_{DD}$ but $\overline{\phi}_S$ somewhat less than V$_{DD}$), and the bit lines D$_1$ and $\overline{D}_1$ are precharged up to the supply voltage V$_{DD}$ by turning FET Qp on with $\phi$p at V$_{DD}$ level. In this case, since FET's Q$_{13}$ and Q$_{14}$ are kept conducting, the nodes M$_1$ and M$_2$ of the sense amplifier 41 are precharged to a potential even with the bit lines D$_1$ and $\overline{D}_1$. Then, a microscopic differential signal according to the level difference between the memory cell MC and the dummy cell (not illustrated) is given between the bit lines D$_1$ and $\overline{D}_1$. The control signal $\overline{\phi}_S$ is kept down to V$_{SS}$ (ground) level simultaneously with the differential signal being given. The sense amplifier 41 is nowe ready for starting a differential signal amplification, and thus, for example, the node M$_1$ settles at a potential of high level (V$_{DD}$) and the node M$_2$ at low level (V$_{SS}$). Next, $\phi_B$ is raised as far as high level (a little lower than V$_{DD}$) of $\phi_S$, and consecuively $\phi_y$ is kept at high level (V$_{DD}$). Thus FET Q$_{15}$ is turned on consecutively to FET Q$_{14}$, an output of the circuit 41 is read out to I/O bus 43 by way of the bit line $\overline{D}_1$ and given to one input of the main amplifier 46. On the other hand, a charge stored beforehand in a capacitor C'$_{11}$ of the reference signal generator circuit 45' connected to the I/O bus 44 is fetched to the I/O bus 44 from FET Q'$_{16}$ being turned on by $\phi_{YB}$ impressed synchronously with the control signal $\phi_Y$, and is then given as another input of the main amplifier 46. A differential signal between both the inputs is amplified by the main amplifier 46 consisting of a flip-flop and fetched as output 46, thereby reading out a data. At the point in time when the data has been read out, $\phi_A$ and $\phi_B$ are kept at high level (V$_{DD}$) again and $\overline{\phi}_S$ is also kept at high level again consecutively. Thus sense amplifier 41 returns to the original steady state, and the read-out data is rewritten in the memory cell. This operation of rewriting is shown in FIG. 6(b).

(2) Writing operation

Figure 6C:
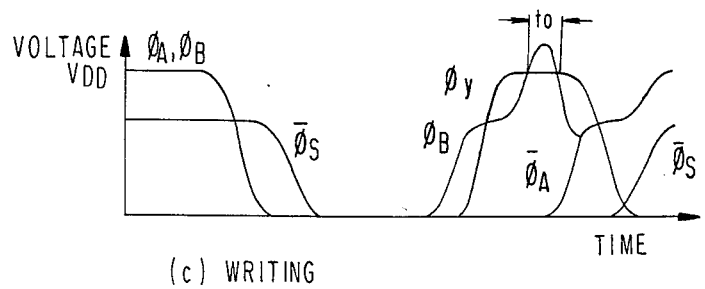

As shown in FIG. 6(c), with $\phi_A$, $\phi_B$ and $\overline{\phi}_S$ at high level once and then $\overline{\phi}_S$ to low level, the sense amplifier 41 is settled to an active state, a read-out data is amplified, $\phi_B$ is then kept to high level of $\overline{\phi}_S$ and $\phi_Y$ to high level consecutively, and FET's Q$_{14}$ and Q$_{15}$ are turned on, thereby taking a write data into the bit line $\overline{D}_1$ from the I/O but 43. Then $\phi_B$ is pushed up to a high level at V$_{DD}$ or over consecutively. In this case, $\phi_A$ is kept at low level (V$_{SS}$). Accordingly, the bit line D$_1$ is isolated from the input node M$_1$ of the sense amplifier 41 to make a change in the state of the sense amplifier 41 easier. FET Q$_{14}$ is impressed with a voltage at V$_{DD}$ or over, therefore a larger drain current can be allowed for FET Q$_{14}$ to flow. Then, a potential at the node M$_2$ which is determined according to the ability ratio of both FET's Q$_{12}$ and Q$_{14}$ when Q$_{12}$ and Q$_{14}$ are turned on will push up the potential on the node M$_2$ for the increasing conductivity of Q$_{14}$, and FET Q$_{11}$ is turned on as a result. Thus, the state of the sense amplifier 41 stabilized with the node M$_1$ at high level and the node M$_2$ at low level can be inverted to have the node M$_1$ at low level and the node M$_2$ at high level under the state that the bit line D$_1$ is electrically separated from the node M$_1$ by making FET Q$_{14}$ off. As described, potentials on the nodes M$_1$ and M$_2$ can be set arbitrarily at low level and high level, low level and low level, or high level and low level respectively. In this case, the bit line D$_1$ remains at high level (V$_{DD}$). After that, if $\phi_A$ and $\phi_B$ are set at a suitable voltage (a high level voltage, for example), then writing is carried out as follows:

| Node M$_1$ | Node M$_2$ | | Bit line D$_1$ | Bit line $\overline{D}_1$ |
|---|---|---|---|---|
| Low level | High level | → | Low level | High level |
| Low level | Low level | → | High level | Low level |
| High level | Low level | → | High level | Low level |

Namely, when the node M$_1$ is kept at low level and the node M$_2$ at high level, FET Q$_{11}$ is turned on and Q$_{12}$ off, and thus the bit line D$_1$ becomes low in level and $\overline{D}_1$ high. When M$_1$ and M$_2$ are low in level both, Q$_{11}$ and Q$_{12}$ are turned off both, and the bit lines D$_1$ and $\overline{D}_1$ are high in level and low respectively at the initial state. When M$_1$ is high in level and M$_2$ low, Q$_{11}$ is turned off but Q$_{12}$ on, and the bit line D$_1$ is high in level and $\overline{D}_1$ low, accordingly.

As described in detail, a preferable memory system shown in FIG. 2 can be realized easily by employing the circuit given in the first embodiment. Further in the circuit, the control signal $\phi_B$ of FET Q$_{14}$ is kept at V$_{DD}$ or over which is a specified high level voltage for a given time t$_0$ (FIG. 6(c)) during a data writing period, thereby increasing an ability of Q$_{14}$ and changing the ability ratio of Q$_{12}$ to Q$_{14}$, while FET Q$_{13}$ is made off so as to separate the bit line D$_1$ from the node M$_1$, and when a high level potential is written in the bit line $\overline{D}_1$, a potential on the node M$_2$ is floated to discharge the node M$_1$ easily, and the state of the sense amplifier 41 is inverted. It is therefore not necessary to charge and discharge the bit line D$_1$ at the time of writing as in the case of prior art, and thus a power consumption involved from charging and discharging all bit lines on one side of the sense amplifier which has been a serious issue hitherto can be saved accordingly, thereby realizing a low power consumption on a memory element. Furthermore, the circuit configuration is extremely simplified to comprise that for which Q$_{13}$ and Q$_{14}$ as transfer gate FET are inserted between the generally-known sense amplifier and the bit line, and further Q$_{15}$ is inserted simply between the bit line B$_{21}$ and the I/O bus 43 as a selecting FET.

As will be apparent from the description given for the first embodiment, the memory circuit of this invention comprises using a reference signal generator well known hitherto for data reading and a variable impedance circuit for writing which operates for holding the potential on the node M$_2$ at a potential necessary for inverting the sense of the sense amplifier 41 time t$_0$ (a time long enough for the potential on the node M$_1$ to discharge through FET Q$_{11}$) at the first stage wherein a data during a writing period is taken in.

Therefore, the variable impedance circuit (Q$_{13}$, Q$_{14}$) may function to float the potential on the node M$_2$ at the time of data writing, and for this reason, the above-mentioned first embodiment is not necessarily binding and any circuit suitable to function similarly will be acceptable. Further two embodiments are taken up below for description.

Figure 7:
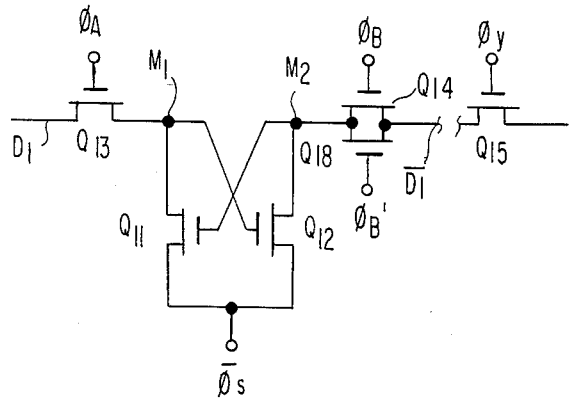
FIG. 7, FIG. 8 and FIG. 9 are diagrams of the second, third and fourth embodiments of this invention.

FIG. 7 shows a major part of a memory circuit representing the second embodiment of this invention which provides a different variable impedance circuit.

This circuit is exactly the same as the arrangement of the first embodiment which is given in FIG. 5 and like numerals refer to like parts. As sixth FET Q$_{18}$ has the source and drain connected in parallel in common with those of the fifth FET Q$_{14}$. In operation of the circuit, the control signal $\phi_B$ is not particularly kept at V$_{DD}$ or over for the time t$_0$ but kept at a normal voltage (high level of $\phi_S$), and $\phi_B$ is kept at high level (V$_{DD}$) for the time t$_0$ instead. Thus by turning FET Q$_{18}$, an ability of FET for which Q$_{14}$ and Q$_{18}$ are combined will be increased (doubled if Q$_{14}$ and Q$_{16}$ are of a structure), the conductivity ratio to Q$_{12}$ changes to float the potential on the node M$_2$, and the node M$_1$ can easily be discharged. In other words, the circuit of this embodiment operates in the same way as that of the first embodiment. Then, if horizontal symmetricalness of the sense amplifier is problematical from inserting FET Q$_{18}$ in the circuit, FET same in structure as Q$_{18}$ will be inserted in parallel with FET Q$_{13}$ with its gate grounded.

As compared with the first embodiment, the second embodiment requires FET more, however, the control signal complicate to have $\phi_B$ kept at a voltage V$_{DD}$ or over for a given period of time is not necessary, therefore the control signal circuit can be simplified and writing can be controlled more accurately.

Figure 8:
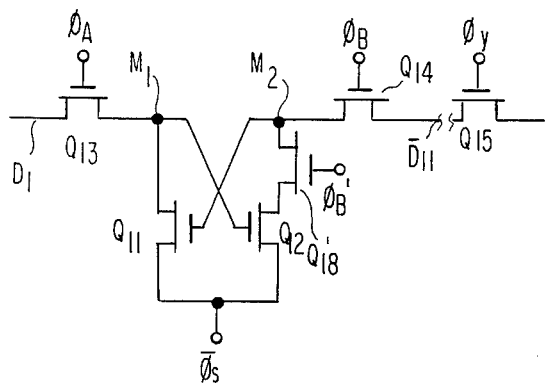

FIG. 8 shows a major part of a memory circuit of the third embodiment of the present invention. The circuit of this embodiment is also same as that of the first embodiment (FIG. 5) barring FET Q'$_{18}$. In the circuit, Q'$_{18}$ is inserted between Q$_{12}$ and node M$_2$ instead of the sixth FET Q$_{18}$ of the second embodiment (FIG. 7). A control signal $\phi'_B$ is kept at high level (V$_{DD}$) at all times to turn FET Q'$_{18}$ on but is kept at low level (V$_{SS}$) only for the time t$_0$ during a writing period. The potential on the node M$_2$ is thus floated to facilitate discharging of the node M$_1$. Namely, the circuit of this embodiment also operates in the same way as those of the previous embodiments. Then, if horizontal symmetricalness of the sense amplifier is problematical from inserting FET Q'$_{18}$ in the circuit, FET same in structure as Q'$_{18}$ will be inserted between Q$_{11}$ and node M$_1$, and the gate voltage is kept always at high level (V$_{DD}$) to ON. Then, it goes without saying that a similar effect will be obtainable from inserting Q'$_{18}$ between Q$_{12}$ and terminal $\overline{\phi_S}$ in the circuit. While the circuit of this embodiment requires FET more as in the case of the second embodiment, the control signal circuit will be simplified and writing can be effected more accurately. However, a power consumption will be unavoidable from keeping Q'$_{18}$ on at all times.

In the above embodiments, the description has referred only to the case where a data is manipulated for read and write from the node M$_2$ side, however, in the case of reading and writing from the node M$_1$ side, the fourth FET Q$_{15}$ and the holding circuit provided on the node M$_2$ side will be provided on the node M$_1$ side symmetrically hitherto.

Figure 9:
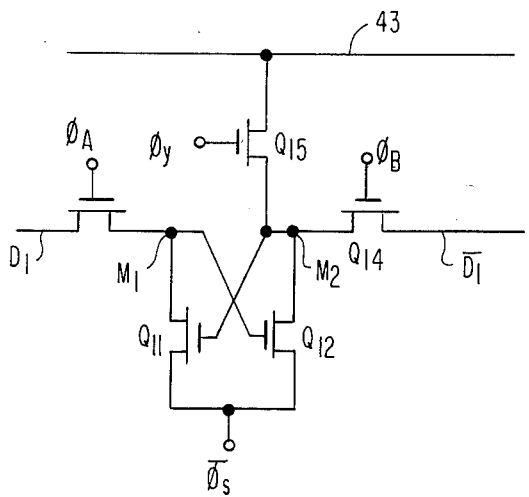

Another embodiment of this invention is shown in FIG. 9. In this embodiment, FET Q$_{15}$ is provided not on the bit line $\overline{D}_1$ but between the node M$_2$ and the I/O bus 43. This embodiment is advantageous for disposing the bit lines D$_1$, $\overline{D}_1$ in parallel, i.e. folded bit line configuration.

As described in detail hereinabove, the sense amplifier circuit according to this invention is simple in its configuration and is ready for data reading, rewriting and writing only from one side of the sense amplifier without charging and discharging particularly the bit line on one side of the sense amplifier. Therefore, an employment of the sense amplifier circuit according to this invention may cut the number of Y decoders to half of that currently in practical application and also make a particular power unnecessary for writing, which is capable of fabricating such memory element as is miniaturized, integrated so high and minimized for consumption power to a remarkable effect.

I claim:

1. A memory circuit comprising first and second bit lines, a plurality of word lines intersecting with said bit lines, a plurality of memory cells arranged at the intersections of said bit lines and word lines, a bus line, a sense amplifier having first and second input nodes, first switching means coupled between said first bit line and said first input node, second switching means coupled between said second bit line and said second input node, third switching means coupled between said bus line and said second input node, first means for operatively enabling said first switching means, second means for operatively enabling said second switching means, third means for selectively enabling said third switching means, and means for controlling said first means, second means and third means such that said second and third switching means are first enabled to determine the state of said sense amplifier by an input signal applied through said bus line with the first switching means disenabled during a single write operation and thereafter said first switching means is enabled to determine the level of said first bit line by said sense amplifier during said single write operation.

2. The memory circuit according to claim 1, in which each of said first to third switching means includes a field effect transistor.

3. The memory circuit according to claim 1, in which said sense amplifier includes a control node, a first field effect transistor coupled between said first input node and said control node and having a gate coupled to said second input node, and a second field effect transistor coupled between said second input node and said control node.

4. The memory circuit according to claim 1, further comprising an output amplifier coupled to said bus line.

5. A memory circuit comprising first and second memory arrays disposed adjacent to each other, each of said first and second memory arrays including a bus line, a plurality of sense amplifiers each having first and second input nodes, a plurality of bit line pairs, each of said bit line pairs being provided for each of said sense amplifiers and including first and second bit lines, a plurality of first switching means each coupled between the first input node of each sense amplifier and first bit line of the associated bit line pair, a plurality of second switching means each coupled between the second input node of each sense amplifier and said bus line, a plurality of word lines intersecting with said bit lines, and a plurality of memory cells each coupled to one of said word lines and one of said digit lines, a plurality of impedance means each coupled between the second input node of each of said sense amplifiers and the second bit line of the associated bit line pair, means for making said impedance means at a low impedance state during a first period in a write mode to thereby determine the state of the sense amplifier by the level of the second bit line of the associated bit line pair, and means for disenabling said first switching means during said first period and enabling said first switching means during a subsequent second period in the write mode so that the level of the first bit line of the associated bit line pair is determined by the associated sense amplifier.

6. The memory circuit according to claim 5, further comprising first and second reference signal generators coupled to the bus lines of said first and second memory arrays, respectively.

7. The memory circuit according to claim 6, further comprising a main amplifier coupled to said bus lines of said first and second arrays.

8. A memory circuit comprising first and second bit lines, a plurality of word lines intersecting with said bit lines, a plurality of memory cells arranged at the intersections of said word lines and said bit lines, a sense amplifier having first and second input nodes, a first field effect transistor coupled between said first bit line and said first input node, a second field effect transistor coupled between said second bit line and said second input node, a bus line, a third field effect transistor coupled between said bus line and said second bit line, means for operatively conducting said third transistor thereby to provide an electrical path between said bus line and said second input node, means for setting a conductance of said second field effect transistor at a small value during a first period in a read or write operation, and means for controlling said first transistor so as to operatively isolate said first bit line from said first input node during said first period and to connect said first bit line to said first node during a subsequent second period in the same read or write operation.

9. The memory circuit according to claim 8, further comprising a main amplifier having a first input terminal coupled to said bus line and a second input terminal and a reference signal generator coupled to said second input terminal and operatively generating a reference signal.

* * * * *

UNITED STATES PATENT AND TRADEMARK OFFICE
CERTIFICATE OF CORRECTION

PATENT NO. : 4,559,619
DATED : December 17, 1985
INVENTOR(S) : Hiroaki IKEDA

It is certified that error appears in the above-identified patent and that said Letters Patent is hereby corrected as shown below:

Column 6, Line 16, "$\phi_s$" should read --$\bar{\phi}_s$--;

Column 7, Line 1 (in table), "Bit line $D_1$" (second occurrence) should read --Bit line $\bar{D}_1$--

Signed and Sealed this

Seventeenth Day of June 1986

[SEAL]

Attest:

DONALD J. QUIGG

Attesting Officer

Commissioner of Patents and Trademarks